United States Patent
Weng et al.

(10) Patent No.: US 7,786,773 B2
(45) Date of Patent: Aug. 31, 2010

(54) PHASE-LOCKED LOOP CIRCUIT

(75) Inventors: Meng-Chih Weng, Tainan County (TW); Kuo-Chan Huang, Tainan County (TW)

(73) Assignee: Himax Technologies Limited, Fonghua Village, Sinshih Township, Tainan County (TW)

( * ) Notice: Subject to any disclaimer, the term of this patent is extended or adjusted under 35 U.S.C. 154(b) by 120 days.

(21) Appl. No.: 12/246,465

(22) Filed: Oct. 6, 2008

(65) Prior Publication Data

US 2010/0085089 A1  Apr. 8, 2010

(51) Int. Cl.
*H03L 7/06* (2006.01)

(52) U.S. Cl. .................. 327/156; 327/147; 327/157; 327/158; 327/161

(58) Field of Classification Search .............. 327/147, 327/156, 157, 161
See application file for complete search history.

(56) References Cited

U.S. PATENT DOCUMENTS

2008/0061895 A1* 3/2008 Kelkar et al. .................. 331/57
2008/0238504 A1* 10/2008 Kwon .......................... 327/156

* cited by examiner

*Primary Examiner*—Lincoln Donovan
*Assistant Examiner*—John W Poos
(74) *Attorney, Agent, or Firm*—Winston Hsu

(57) ABSTRACT

A phase-locked loop circuit for generating an output signal includes a phase frequency detector (PFD), a processing module, and a clock generator. The PFD is implemented for generating a plurality of indicating signals according to a first reference signal and a feedback signal, where the feedback signal is generated according to the output signal. The processing module is coupled to the PFD, and is implemented for generating a control signal according to the indicating signals and a plurality of clock signals, where the clock signals have an identical frequency but different phases. The clock generator is coupled to the processing module, and is implemented for generating the clock signals according to the control signal. The output signal is generated according to a specific clock signal selected from the clock signals.

9 Claims, 8 Drawing Sheets

PHASE-LOCKED LOOP CIRCUIT

BACKGROUND OF THE INVENTION

1. Field of the Invention

The present invention relates to a phase-locked loop circuit, and more particularly, to a phase-locked loop circuit with a partial digitalized structure for suppressing excess leakage current and simultaneously improving the performance of the phase-locked loop circuit.

2. Description of the Prior Art

A phase-locked loop (PLL) circuit is a common electronic circuit using a feedback scheme to simultaneously reference instant phases of both a reference signal and a feedback signal, thereby outputting a required clock signal. When a phase relation between two different clock signals stays within a required fixed range, the PLL circuit at this time is in a "phase locked" status.

Please refer to FIG. 1. FIG. 1 is a block diagram illustrating a conventional PLL circuit 100. The conventional PLL circuit 100 includes a detecting circuit 120 (e.g., a phase/frequency detector, PFD), a charge pump 130, a low pass filter 140, and an oscillator 150 (e.g., a voltage controlled oscillator, VCO); moreover, a PLL circuit (e.g., the PLL circuit 100) may further include a first frequency divider 110 (having a frequency-dividing factor expressed as N) and/or a second frequency divider 160 (having a frequency-dividing factor expressed as M).

The first frequency divider 110 will divide a reference signal $F_{ref}$ to make a frequency of the frequency-divided reference signal $F_{ref-div}$ generated from the first frequency divider 110 be 1/N times that of the reference signal $F_{ref}$. Simultaneously, the output signal $F_{out}$ is fed back to the second frequency divider 160, and the second frequency divider 160 divides a frequency of the output signal $F_{out}$ to generate the frequency-divided feedback signal $F_{fb-div}$ that has a frequency equal to 1/M times that of the output signal $F_{out}$.

As shown in FIG. 1, the detecting circuit 120 detects a phase relation between the frequency-divided reference signal $F_{ref-div}$ and a frequency-divided feedback signal $F_{fb-div}$ to thereby output a detecting signal indicative of a phase leading condition or phase lagging condition between two inputs of the detecting circuit 120. Therefore, the outputted detecting signal is selectively an up signal UP or a down signal DN, depending upon the phase comparison result.

The charge pump 130 and the low pass filter 140 are used to generate a control signal (e.g., a voltage signal $V_{ctr}$) as an input signal of the oscillator 150 according to the detecting signal (i.e., the up signal UP or the down signal DN); in this way, the oscillator 150 is then capable of generating the output signal $F_{out}$ with a specific frequency according to magnitude of the control signal $V_{ctr}$. The frequency of the output signal $F_{out}$ is equal to $$F_{ref} * \frac{M}{N},$$

where $F_{ref}$ represents the frequency of the input reference signal $F_{ref}$ and M and N represent frequency-dividing factors mentioned above.

That is, in a PLL circuit 100, the oscillator 150 generates an output signal $F_{out}$ with a specific frequency in response to a control signal (e.g., $V_{ctr}$). If the control signal (e.g., $V_{ctrl}$) has poor signal quality and fails to keep at a required voltage level, the incorrect control signal $V_{ctrl}$ would lead to the improper output signal $F_{out}$.

Because of the charge pump 130, the low pass filter 140 and the oscillator 150 employed in the conventional PLL circuit 100 however, are commonly implemented using analog circuits. If the frequency-dividing factor N is large (i.e., 1/N is small) and/or if the reference signal $F_{ref}$ has low frequency, the detecting circuit 120 will hence compare the two input signals, i.e., $F_{ref-div}$ and $F_{fb-div}$, in a long period, resulting in an unstable control signal $V_{ctrl}$. This degrades performance of the conventional PLL circuit 100.

FIG. 2 is a block diagram illustrating partial structure of the PLL circuit 100 shown in FIG. 1. As shown in FIG. 2, the low pass filter 140 is implemented using a resistor 142 and two capacitors 144 and 146. The conventional analog structures of the low pass filter 140 and the charge pump 130 will make the voltage V1 be extremely affected by the leakage current via the resistor 142 and the capacitors 144 and 146 and hence make the voltage signal $V_{ctrl}$ difficult to maintain at the demanded voltage. This causes the conventional oscillator 150 to generate an incorrect output signal $F_{out}$, and degrades performance of the PLL circuit 100. In other words, the resultant frequency of the output signal $F_{out}$ is probably not equal to the desired frequency $$F_{ref} * \frac{M}{N}.$$

In view of at least these issues mentioned above, it becomes clear that there remains considerable room for improvement of conventional PLL circuits.

SUMMARY OF THE INVENTION

It is therefore an objective of the present invention to solve the aforementioned problems by providing a phase-locked loop circuit with partial digitalized structure to suppress excess leakage current to thereby keep the input signal of the oscillator stable even if the PLL circuit receives an input reference signal with a low frequency or has a first frequency divider with a large frequency-dividing factor N. In this way, the performance of the phase-locked loop circuit is greatly improved.

According to one exemplary embodiment of the present invention, a phase-locked loop circuit for generating an output signal is disclosed. The phase-locked loop circuit includes a phase frequency detector (PFD), a processing module, and a clock generator. The PFD is implemented for generating a plurality of indicating signals according to a first reference signal and a feedback signal, where the feedback signal is generated according to the output signal. The processing module is coupled to the PFD, and is implemented for generating a control signal according to the indicating signals and a plurality of clock signals, where the clock signals have an identical frequency but different phases. The clock generator is coupled to the processing module, and is implemented for generating the clock signals according to the control signal. The output signal is generated according to a specific clock signal selected from the clock signals.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " The terms "coupled" and "couples" are intended to mean either an indirect or a direct electrical connection. Thus, if a first device couples to a second device, that connection may be through a direct electrical connection, or through an indirect electrical connection via other devices and connections.

Figure 1:
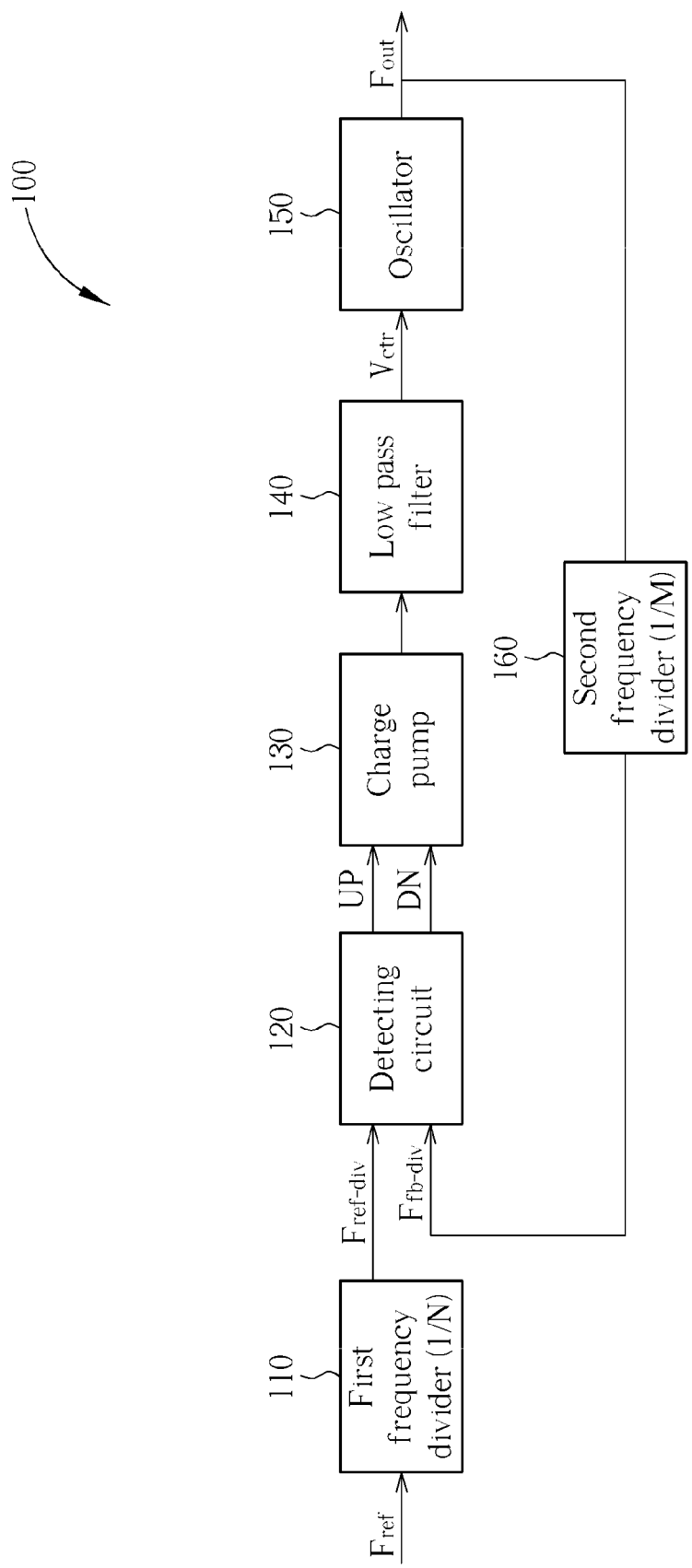
FIG. 1 is a block diagram illustrating a conventional phase-locked loop (PLL) circuit.
Figure 2:
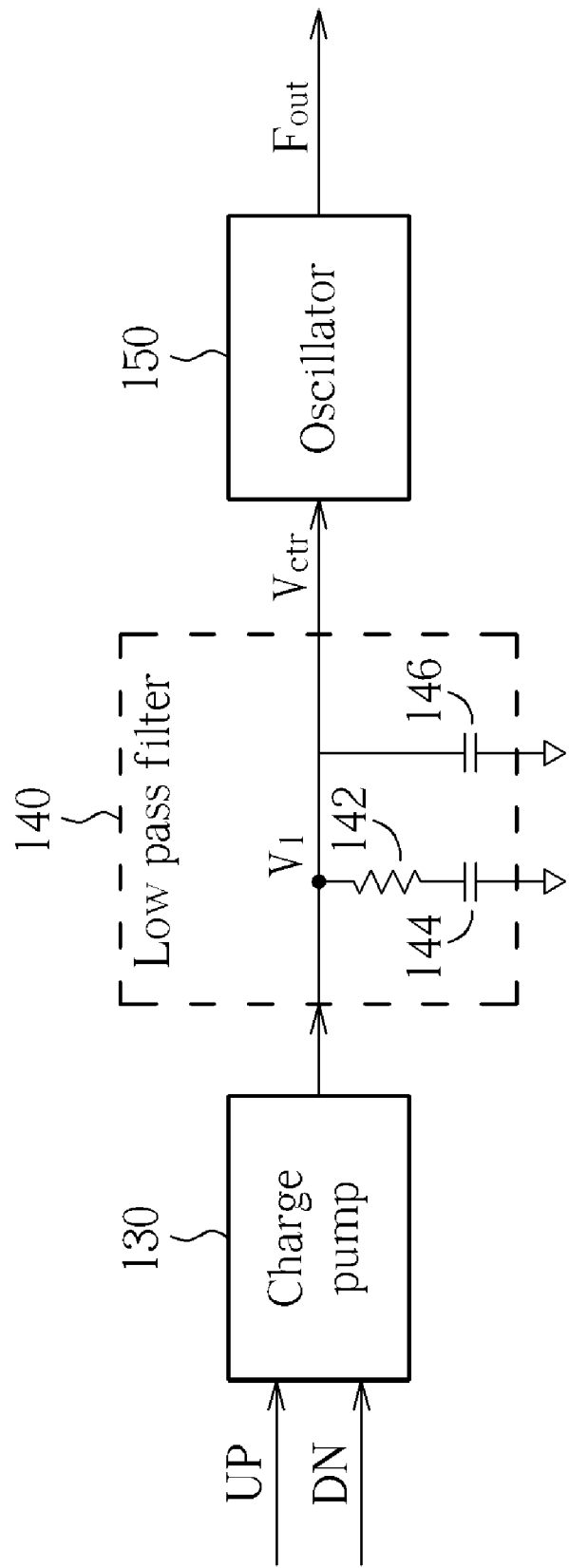
FIG. 2 is a block diagram illustrating partial structure of the PLL circuit shown in FIG. 1.
Figure 3:
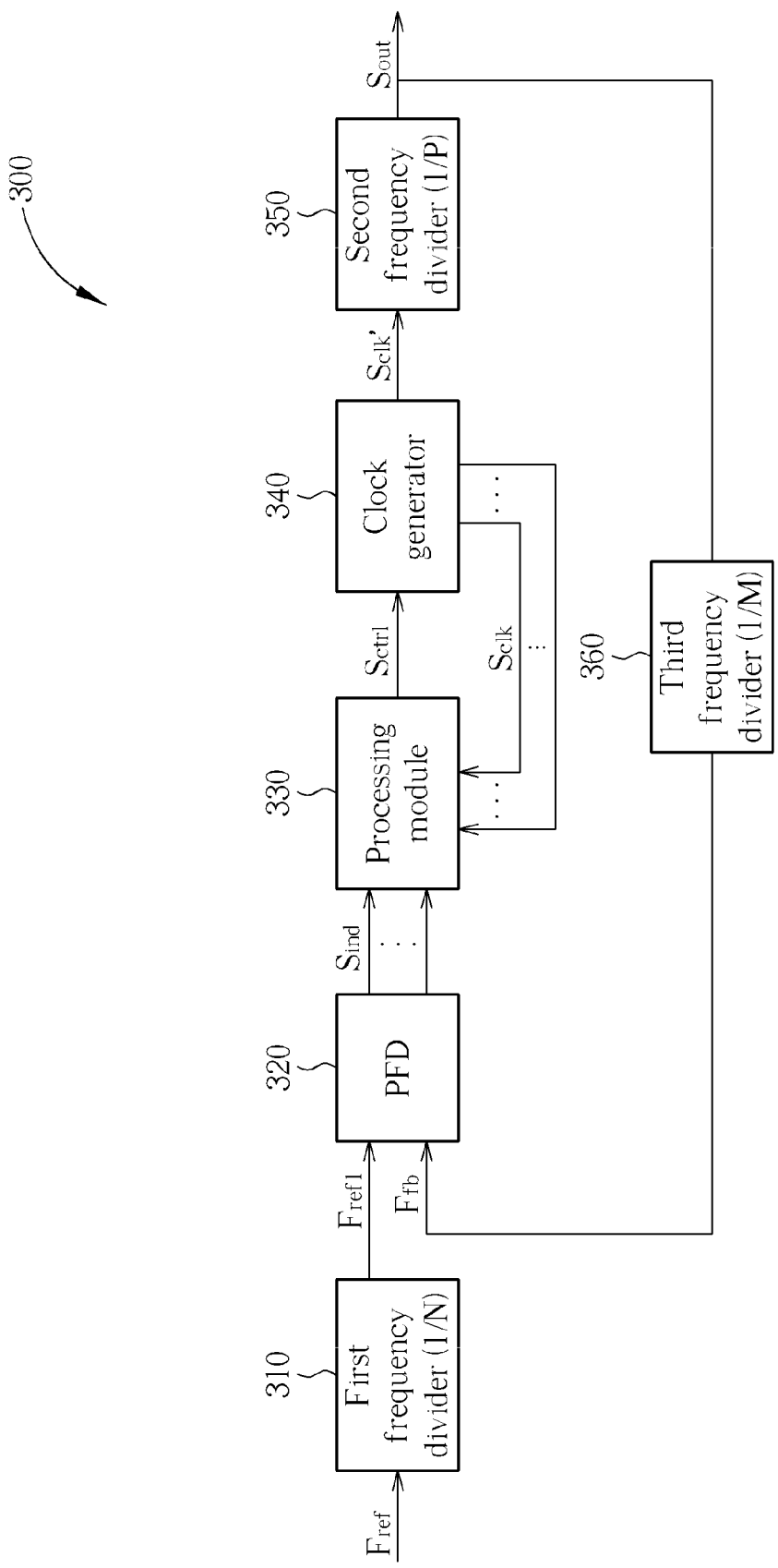
FIG. 3 is a diagram illustrating a phase-locked loop (PLL) circuit according to an embodiment of the present invention.

Please refer to FIG. 3. FIG. 3 is a diagram illustrating a phase-locked loop (PLL) circuit 300 according to an embodiment of the present invention. As shown in FIG. 3, the phase-locked loop circuit 300 includes, but is not limited to, a first frequency divider 310, a phase frequency detector (PFD) 320, a processing module 330, a clock generator 340, a second frequency divider 350, and a third frequency divider 360. In this embodiment, the first frequency divider 310 has a frequency-dividing factor expressed as N, and the first frequency divider 310 is configured to divide frequency of a second reference signal $F_{ref2}$ for generating a first reference signal $F_{ref1}$. The PFD 320 is coupled to the first frequency divider 310, and is used to generate a plurality of indicating signals $S_{ind}$ according to the first reference signal $F_{ref1}$ and a feedback signal $F_{fb}$, wherein the indicating signals $S_{ind}$ include a first indicating signal UP and a second indicating signal DN. Moreover, the feedback signal $F_{fb}$ (i.e., another input signal of the PFD 320) in this embodiment is generated according to an output signal $S_{out}$ fed to the second frequency divider 350.

That is, the PFD 320 receives an output of the third frequency divider 360 as the feedback signal $F_{fb}$ having frequency equal to $$\frac{S_{out}}{M},$$

where $S_{out}$ represents the frequency of the output signal $S_{out}$ and M represents the frequency-dividing factor employed by the third frequency divider 360.

The processing module 330 is coupled to the PFD 320, and is implemented to generate a control signal $S_{ctrl}$ for controlling the clock generator 340 (e.g., a controllable oscillator). In this embodiment, the processing module 330 generates the control signal $S_{ctrl}$ according to the inputted indicating signals $S_{ind}$ and a plurality of clock signals $S_{clk}$; the clock signals $S_{clk}$ here are generated from the clock generator 340 for sampling the indicating signals $S_{ind}$ provided by the PFD 320.

In the present invention, the clock generator 340 is implemented using a ring oscillator. In addition, the clock signals $S_{clk}$ generated by the ring oscillator have identical frequency but different phases. Since the associated operation and functionality of the ring oscillator are well known to people skilled in this art, further description is omitted here for the sake of brevity.

As shown in FIG. 3, the second frequency divider 350 is coupled to the clock generator 340 (e.g., a ring oscillator), wherein a frequency-dividing factor employed by the second frequency divider 350 is expressed as P. The second frequency divider 350 divides frequency of a specific clock signal $S_{clk}'$ generated to the second frequency divider 350 to generate the output signal $S_{out}$. In other words, the output signal $S_{out}$ is generated according to the specific clock signal $S_{clk}'$ selected from the clock signals $S_{clk}$ generated from the clock generator 340.

The second frequency divider 350 is an optional element, however, and is used for lowering the frequency of the specific clock signal $S_{clk}'$ to thereby get the output signal $S_{out}$ with a lower frequency equal to $$S_{clk}' * \frac{1}{P},$$

where $S_{clk}'$ represents the frequency of the specific clock signal $S_{clk}'$ generated to the second frequency divider 350, and P is the frequency-dividing factor of the second frequency divider 350.

In this embodiment, the phase locked loop circuit 300 also includes a third frequency divider 360 with a frequency-dividing factor set by M. As shown in FIG. 3, the third frequency divider 360 is implemented for dividing frequency of the output signal $S_{out}$ to generate the feedback signal $F_{fb}$ acting as one of the input signals received by the PFD 320.

In other embodiments of the present invention where the second frequency divider 350 in the PLL circuit 300 is omitted, the third frequency divider 360 in this case is modified to couple to the clock generator 340, and hence generates the feedback signal $F_{fb}$ having a frequency equal to $$S_{clk}' * \frac{1}{M},$$

where $S_{clk}'$ represents frequency of the specific clock signal $S_{clk}'$ which serves as the output signal $S_{out}$ due to omission of the second frequency divider 350, and M represents the frequency-dividing factor employed by the third frequency divider 360. Such an alternative design also obeys the spirit of the present invention, and falls within the scope of the present invention.

It should be noted that the third frequency divider 360 could be an optional element, depending upon design requirements. More specifically, as the output signal of the PLL circuit 300 is generally designed to be a high-frequency clock signal, the third frequency divider 360 is therefore implemented to make the feedback signal $F_{fb}$ have an acceptable frequency comparable to that of the other input signal of the PFD 320.

Please note that the hardware configuration shown in FIG. 3 is for illustrative purposes only. Other hardware configurations and modifications obeying the spirit of the present invention are feasible. For example, the first frequency divider 310, the second frequency divider 350, and the third frequency divider 360 are optional components, and one or more of the frequency dividers could be omitted, depending upon design requirements. In addition, the components illustrated in FIG. 3 are not limited to be disposed in the phase locked loop circuit 300 separately.

Figure 4:
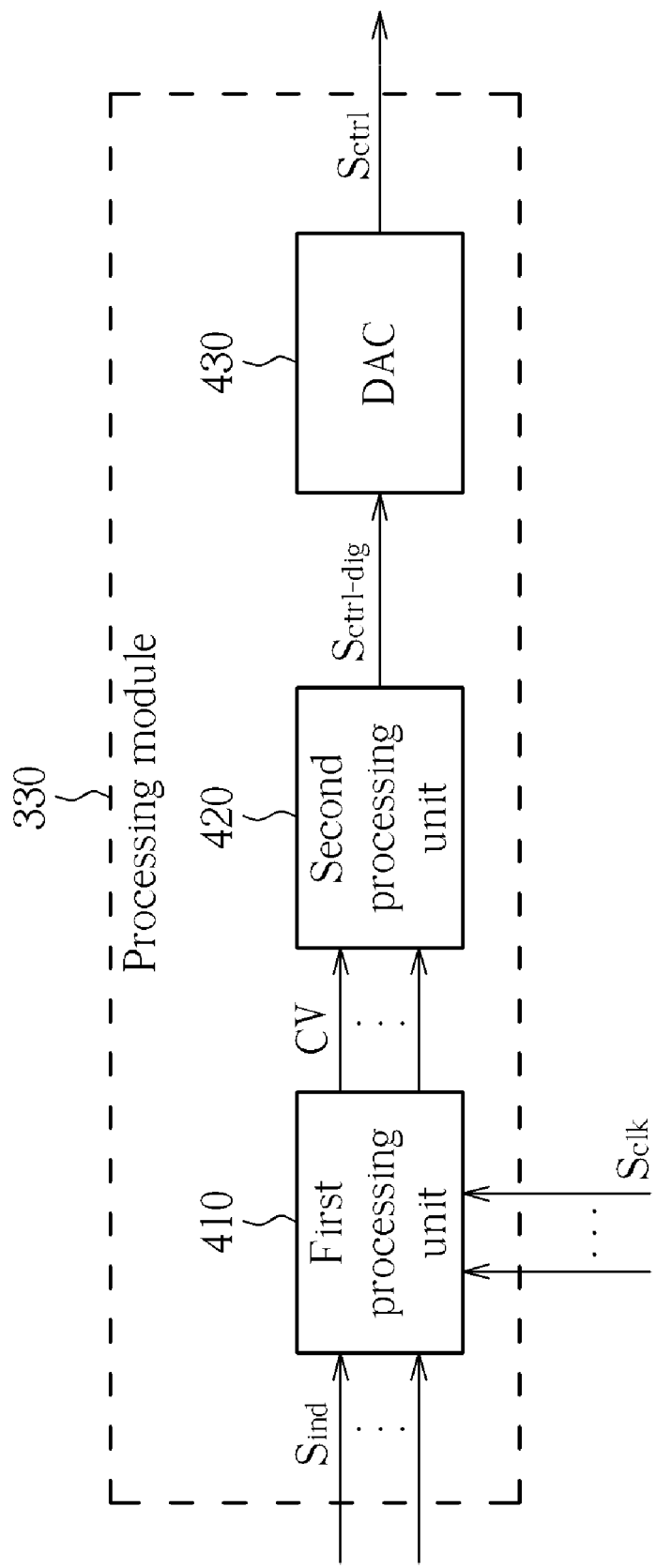
FIG. 4 is a block diagram of a processing module shown in FIG. 3 according to an embodiment of the present invention.
Figure 5:
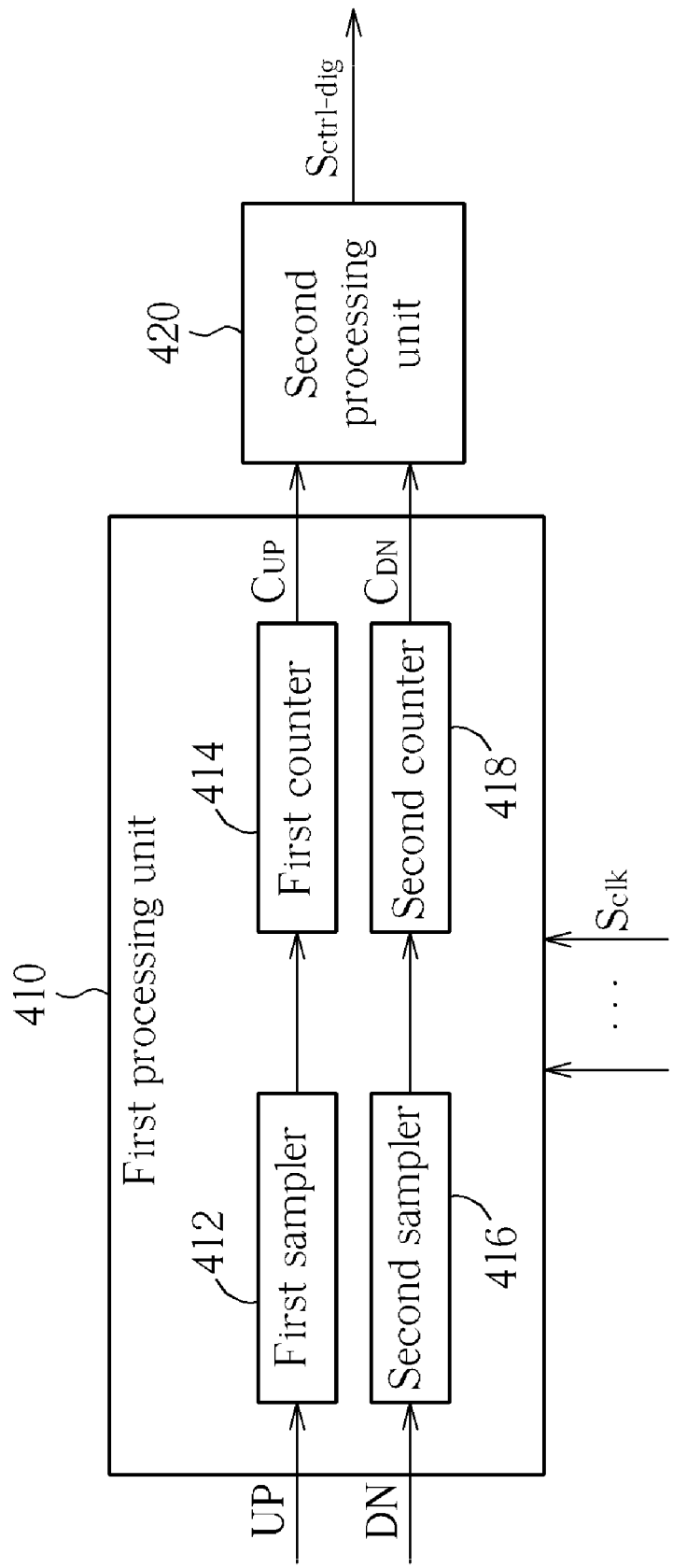
FIG. 5 is a block diagram illustrating a first processing unit and a second processing unit shown in FIG. 4 according to an embodiment of the present invention.

Please refer to FIG. 4 and FIG. 5, in conjunction with FIG. 3. FIG. 4 is a block diagram illustrating the processing module 330 shown in FIG. 3 according to an embodiment of the present invention. FIG. 5 is a block diagram illustrating a first processing unit 410 and a second processing unit 420 shown in FIG. 4 according to an embodiment of the present invention. As shown in FIG. 4, the processing module 330 includes, but is not limited to, a first processing unit 410, a second processing unit 420 and a digital-to analog converter (DAC) 430. As shown in FIG. 5, the first processing unit 410 includes, but is not limited to, a first sampler 412, a first counter 414, a second sampler 416, and a second counter 418. The first processing unit 410 is configured to sample the indicating signals $S_{ind}$, thereby generating a plurality of calculating values according to the clock signals $S_{clk}$, respectively.

As shown in FIG. 4, the second processing unit 420 in this exemplary embodiment is implemented using an adding unit coupled to the first processing unit 410 and the digital-to-analog converter 430, and is implemented for generating a digital control signal $S_{ctrl-dig}$ according to the calculating values. Furthermore, the digital-to-analog converter 430, in this embodiment, is used for converting the digital control signal $S_{ctrl-dig}$ into an analog control signal $S_{ctrl}$ to the following clock generator 340 shown in FIG. 3.

Figure 6:
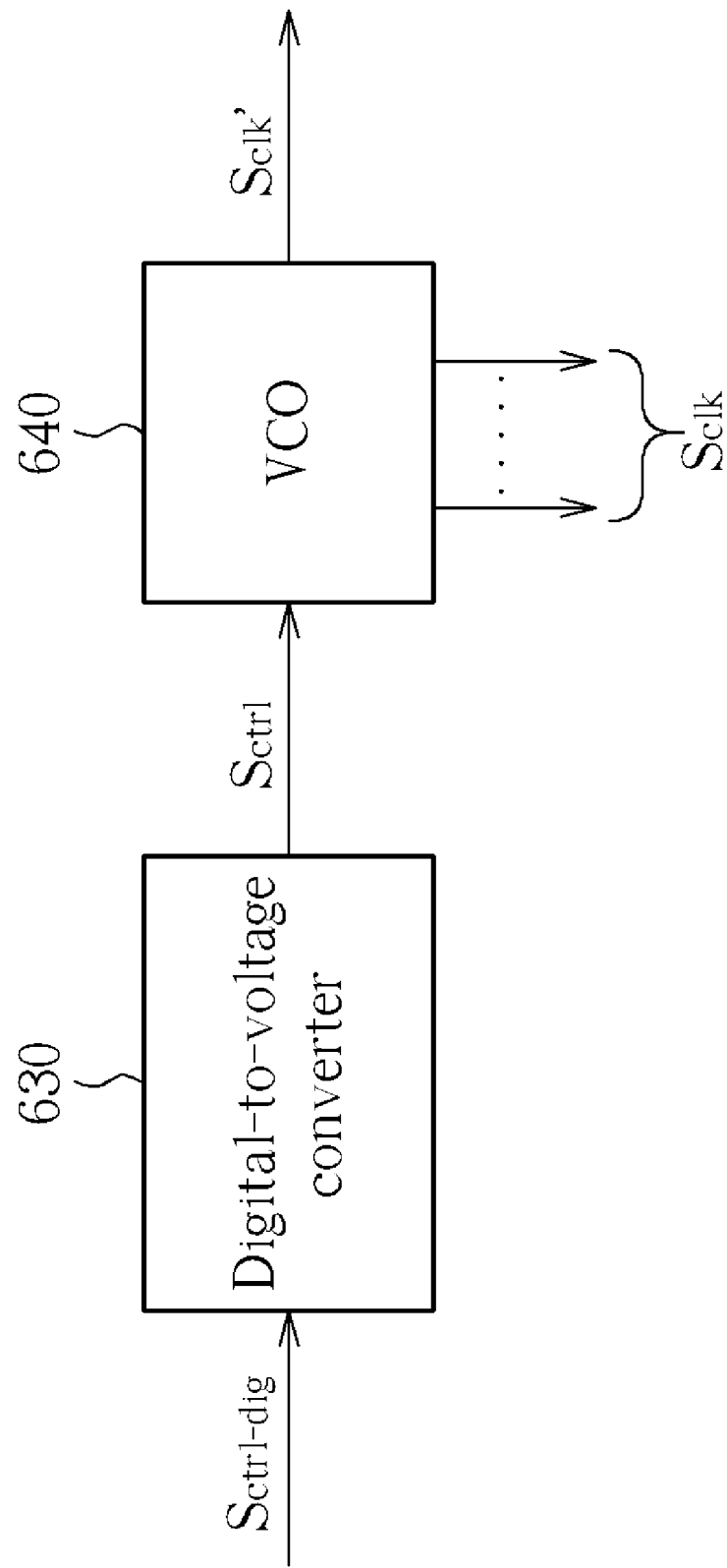
FIG. 6 is a block diagram illustrating one exemplary implementation of a digital-to-analog converter shown in FIG. 4 and a clock generator 340 shown in FIG. 3.

In one exemplary implementation, the clock generator 340 could be implemented using any voltage controlled clock generator for receiving the analog voltage signal $S_{ctrl}$ generated from the preceding circuit component. Please refer to FIG. 6. FIG. 6 is a block diagram illustrating one exemplary implementation of the digital-to-analog converter 430 shown in FIG. 4 and the clock generator 340 shown in FIG. 3. In this exemplary implementation, the digital-to-analog converter 430 in FIG. 4 is implemented using a digital-to-voltage converter 630, and the clock generator 340 in FIG. 3 is implemented using a voltage controlled oscillator (VCO) 640 accordingly.

Figure 7:
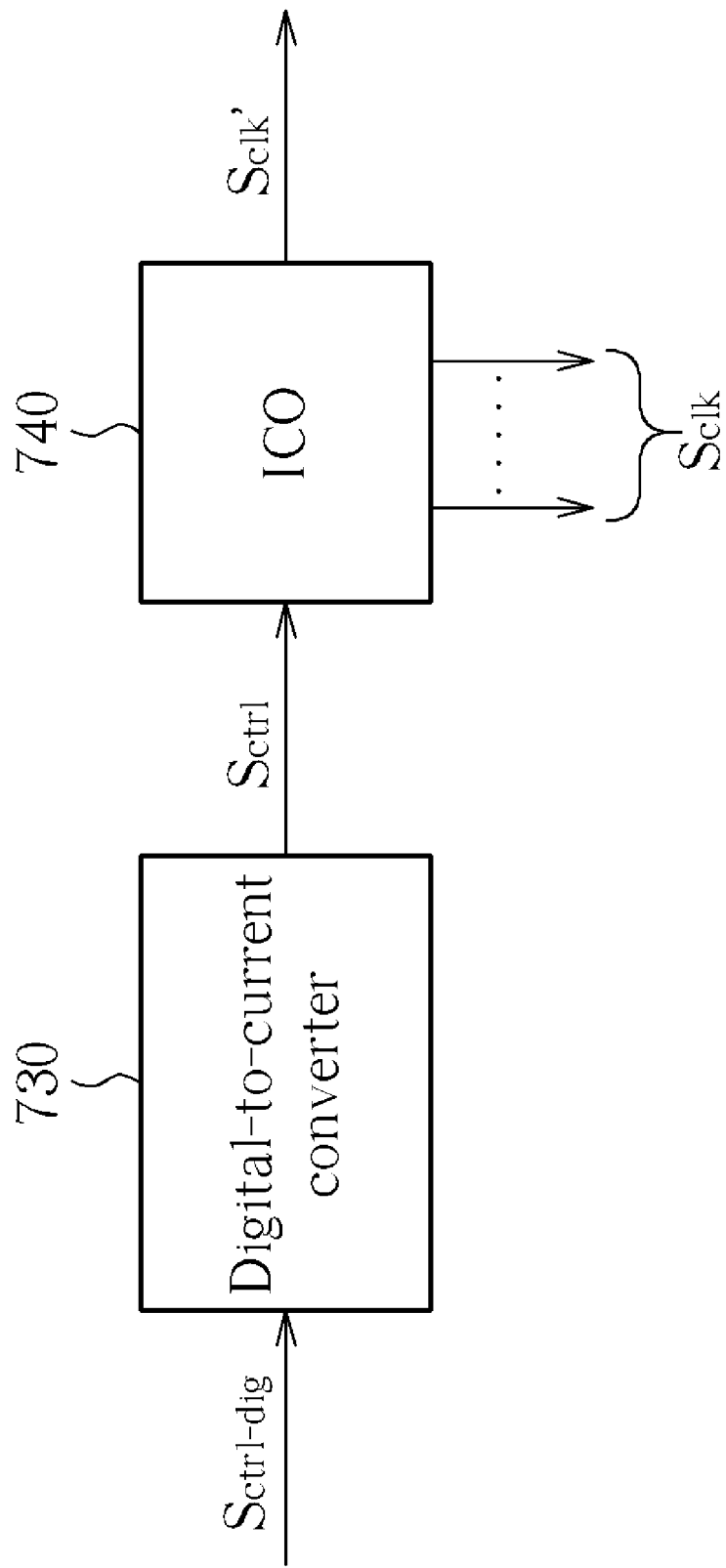
FIG. 7 is a block diagram illustrating another exemplary implementation of the digital-to-analog converter shown in FIG. 4 and the clock generator shown in FIG. 3.

In another exemplary implementation, the clock generator 340 could be implemented using any current controlled clock generator for receiving the analog voltage signal $S_{ctrl}$ generated from the preceding circuit component. Please refer to FIG. 7. FIG. 7 is a block diagram illustrating another exemplary implementation of the digital-to-analog converter 430 shown in FIG. 4 and the clock generator 340 shown in FIG. 3. In this exemplary implementation, the digital-to-analog converter 430 in FIG. 4 is implemented using a digital-to-current converter 730, and the clock generator 340 in FIG. 3 is implemented using a current controlled oscillator (ICO) 740 accordingly.

As shown in FIG. 4 and FIG. 5, the first sampler 412 samples a first indicating signal UP of the indicating signals $S_{ind}$ by utilizing the clock signals $S_{clk}$ to generate first sampled values. The first counter 414 is coupled to the first sampler 412, and is used to count sampled values among the first sampled values with a predetermined logic value (e.g., logic '1' in this embodiment) to thereby generate a first calculating value $C_{up}$. Simultaneously, as shown in FIG. 5, the second sampler 416 generates second sampled values by sampling a second indicating signal DN of the indicating signals $S_{ind}$ according to the clock signals $S_{clk}$. The second counter 418 counts sampled values among the second sampled values with a predetermined logic value (e.g., logic '1') to thereby generate a second calculating value $C_{DN}$ accordingly.

Figure 8:
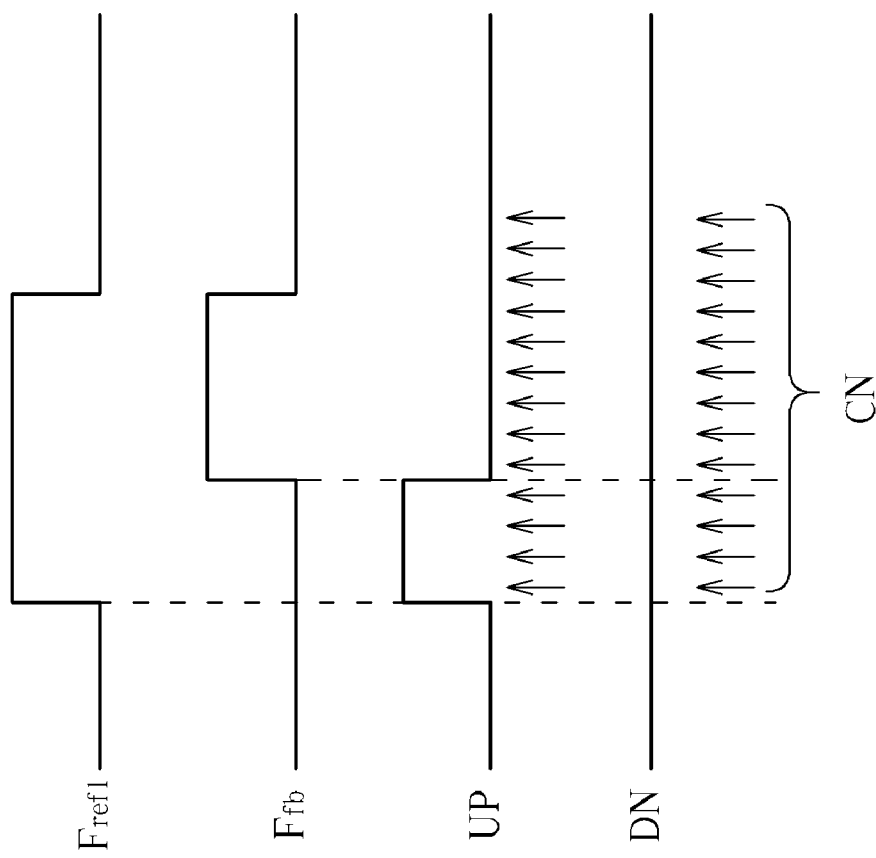
FIG. 8 is a diagram illustrating relations between a first reference signal $F_{ref1}$, a feedback signal $F_{fb}$, a first indicating signal UP and a second indicating signal DN according to an embodiment of the present invention.

Please refer to FIG. 8 in conjunction with FIG. 5. FIG. 8 is a diagram illustrating relations between the first reference signal $F_{ref1}$, the feedback signal $F_{fb}$, the first indicating signal UP and the second indicating signal DN according to an embodiment of the present invention. As shown in FIG. 8, the first counter 414 and the second counter 418 are set to count the number of sampled values that have a high logic value (i.e., logic '1') to generate a first calculating value $C_{up}$ and the second calculating value $C_{DN}$ respectively.

In addition, in this embodiment, the first counter 414 is reset per CN first sampled values and the second counter 418 is reset per CN second sampled values, where CN is an integer. Furthermore, the second processing unit 420 generates the digital control signal $S_{ctrl-dig}$ according to a difference between the first calculating value generated per CN first sampled values and the second calculating value generated per CN second sampled values.

Suppose that, in this embodiment, CN is 13 for both the first sampler 412 and the second counter 416. As shown in FIG. 8, since the phase of the first reference signal $F_{ref1}$ leads the phase of the feedback signal $F_{fb}$, the first counter 414 counts the first sampled values with a high logic value and then the first counter 414 calculates the first calculating value $C_{up}$ as 4 (FIG. 8). At the same time, the second sampler 416 samples the second indicating signal $S_{ind2}$ and the second counter 418 counts the second sampled values with a high logic value, and then the second counter 418 calculates the second calculating value $C_{DN}$ as 0.

That is, in this embodiment, the second processing unit 420 is an adding unit for generating the digital control signal $S_{ctrl-div}$ according to a difference between the first calculating value $C_{up}$ generated per CN first sampled values and the second calculating value generated per CN second sampled values. The digital control signal $S_{ctrl-div}$ is expressed by equation (1) as follows:

$$S_{ctrl-div}(n+1) = S_{ctrl-div}(n) + C_{up} - C_{DN} \quad (1)$$

In the above equation (1), ($C_{UP} - C_{DN}$) represents the required adjustment amount of the first reference signal $F_{ref1}$. However, it should be noted that ($C_{UP} - C_{DN}$) is restricted to be smaller or equal to CN. The relation is expressed as follows:

$$(C_{UP} - C_{DN}) \leq CN \quad (2)$$

Please note that the above example is for illustrative purposes only and not meant to be a limitation of the present invention. With appropriate modifications, the first counter 414 and the second counter 418 are capable of being set to count the number of sampled values that have a low logic value (i.e., logic '0') to generate the first calculating value $C_{up}$ and the second calculating value $C_{DN}$ respectively. In this way, the same objective of calculating the relative information between the first indicating signal UP and the second indicating signal DN is achieved.

As shown in FIG. 5, in this embodiment, the first sampler 412 samples the first indicating signal UP by the clock signals $S_{clk}$ with identical frequency but different phases, where the clock signals $S_{clk}$ are generated by the clock generator 340 mentioned above. For making the control signal $S_{ctrl}$ more precise, in this embodiment the clock generator 340 is implemented using a ring oscillator for generating the clock signals with more different phases to act as the sampling signals.

Since in this embodiment the sampling signals are the clock signals $S_{clk}$ generated by the clock generator 340, if the ring oscillator (i.e., clock generator 340) has A inverters cascaded in a ring fashion, an interval between each two sampling signals (i.e., two clock signals $S_{clk}$) hence can be expressed as $$\frac{1}{\text{clockgenerator\_freq}} * \frac{1}{A},$$

where clockgenerator_freq represents the frequency of the clock signal $S_{clk}$ and A represents the number of different phases that the clock generator 340 generates in a single period.

When the DAC 430 is a digital-to-voltage converter as shown in FIG. 6, the control signal $S_{ctrl}$ can be expressed as below:

$$S_{ctrl} = V_{base} + S_{ctrl\text{-}dig} * K_{dv} \qquad (3)$$

In the above equation (3), $V_{base}$ represents a constant voltage (optional), and $K_{dv}$ represents a gain value of the digital-to-voltage converter. Since the internal architectures of the digital-to-voltage converter, the voltage controlled oscillator, the digital-to-current converter and the current control oscillator are known to people skilled in this art, further description are omitted here for the sake of brevity.

To put it briefly, if the clock generator 340 is a voltage controlled generator and a gain value of the clock generator 340 is expressed as $K_{vco}$, a bandwidth of the PLL circuit 300 then can be expressed as:

$$\text{PLL\_Bandwidth} = CN * K_{dv} * K_{vco} * \frac{1}{P} * \frac{1}{M} \qquad (4)$$

The frequency variance of the PLL circuit 300 in each time is under $$\frac{1}{10} * \frac{F_{ref}}{N},$$

as below:

$$CN * K_{dv} * K_{vco} * \frac{1}{P} * \frac{1}{M} < \frac{1}{10} * F_{ref} * \frac{1}{N} \qquad (5)$$

In conclusion, the aforementioned embodiment of the present invention provides a circuit structure capable of suppressing undesired leakage current for generating a control signal $S_{ctrl}$ with required precise voltage value by using digital circuit(s) (i.e., the first processing unit 410 and second processing unit 420). By using a partial digitalized structure within, the PLL circuit (PLL circuit 300) in the present invention hence improves the accuracy of the output signal $S_{clk}$.

Compared with conventional PLL circuits, the disclosed PLL circuit generates an output signal precisely even if a frequency of the second reference signal $F_{ref}$ is low and/or the frequency-dividing factor N of the first frequency divider is small.

Those skilled in the art will readily observe that numerous modifications and alterations of the device and method may be made while retaining the teachings of the invention.

What is claimed is:

1. A phase-locked loop circuit for generating an output signal, comprising:
    a phase frequency detector (PFD), for generating a plurality of indicating signals according to a first reference signal and a feedback signal, wherein the feedback signal is generated according to the output signal;
    a processing module, coupled to the PFD, for generating a control signal according to the indicating signals and a plurality of clock signals, wherein the clock signals have an identical frequency but different phases; and
    a clock generator, coupled to the processing module, for generating the plurality of clock signals according to the control signal, wherein the output signal is generated according to a specific clock signal selected from the plurality of clock signals.

2. The phase-locked loop circuit of claim 1, wherein the processing module comprises:
    a first processing unit, coupled to the phase frequency detector, for generating a plurality of calculating values respectively corresponding to the indicating signals according to the clock signals;
    a second processing unit, coupled to the first processing unit, for generating a digital control signal according to the calculating values; and
    a digital-to-analog converter, coupled to the second processing unit, for converting the digital control signal into the control signal and outputting the control signal to the clock generator.

3. The phase-locked loop circuit of claim 2, wherein the first processing unit comprises:
    a first sampler, for sampling a first indicating signal of the indicating signals by utilizing the clock signals to generate a first sampled value accordingly;
    a second sampler, for sampling a second indicating signal of the indicating signals by utilizing the clock signals to generate a second sampled value accordingly;
    a first counter, coupled to the first sampler, for counting sampled values that have a predetermined logic value among the first sampled values to generate a first calculating value of the calculating values, wherein the first counter is reset per N first sampled values; and
    a second counter, coupled to the second sampler, for counting sampled values that have a predetermined logic value among the second sampled values to generate a second calculating value of the calculating values, wherein the second counter is reset per N second sampled values, and N is an integer;
    wherein the second processing unit generates the digital control signal according to a difference between the first calculating value generated per N first sampled values and the second calculating value generated per N second sampled values.

4. The phase-locked loop circuit of claim 2, wherein the clock generator is a ring-type oscillator.

5. The phase-locked loop circuit of claim 4, wherein the ring-type oscillator is a voltage controlled oscillator (VCO), and the digital-to-analog converter is a digital-to-voltage converter.

6. The phase-locked loop circuit of claim 4, wherein the ring-type oscillator is a current controlled oscillator (ICO) and the digital-to-analog converter is a digital-to-current converter.

7. The phase-locked loop circuit of claim 1, further comprising a frequency divider, coupled to the PFD, for dividing frequency of a second reference signal to generate the first reference signal.

8. The phase-locked loop circuit of claim 1, further comprising a frequency divider, coupled to the clock generator and the PFD, for dividing frequency of the output signal to generate the feedback signal.

9. The phase-locked loop circuit of claim 1, further comprising a frequency divider, coupled to the clock generator, for dividing frequency of the specific clock signal to generate the output signal.

* * * * *